(12) United States Patent
Jin et al.

(10) Patent No.: US 6,808,944 B1
(45) Date of Patent: Oct. 26, 2004

(54) STRUCTURE AND METHOD FOR MONITORING A SEMICONDUCTOR PROCESS, AND METHOD OF MAKING SUCH A STRUCTURE

(75) Inventors: Bo Jin, Campbell, CA (US); Kaichiu Wong, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 379 days.

(21) Appl. No.: 09/621,717

(22) Filed: Jul. 24, 2000

(51) Int. Cl.$^7$ .............................................. G01R 31/26
(52) U.S. Cl. ..................... 438/14; 438/149; 438/423; 438/424; 438/691
(58) Field of Search ................................ 438/149, 404, 438/423, 424, 14, 691, 692

(56) References Cited

U.S. PATENT DOCUMENTS

| | | | | |
|---|---|---|---|---|
| 5,290,396 A | * | 3/1994 | Schoenborn et al. | ........ 438/427 |
| 6,214,694 B1 | * | 4/2001 | Leobandung et al. | ....... 438/413 |
| 6,300,172 B1 | * | 10/2001 | Ang et al. | .................. 438/149 |
| 6,399,427 B1 | * | 6/2002 | Yu | .............................. 438/149 |
| 6,410,938 B1 | * | 6/2002 | Xiang | .......................... 257/49 |
| 6,420,218 B1 | * | 7/2002 | Yu | .............................. 438/142 |

* cited by examiner

*Primary Examiner*—Mary Wilczewski
*Assistant Examiner*—Toniae M. Thomas
(74) *Attorney, Agent, or Firm*—Bradley T. Sako

(57) ABSTRACT

According to one embodiment, a structure for monitoring a process step may include an etch stop layer (102) formed on a substrate (104) and a trench emulation layer (106) formed over an etch stop layer (102). Monitor trenches (108) may be formed through a trench emulation layer (106) that terminate at an etch stop layer (102). Monitor trenches (108) may have a depth equal to a trench emulation layer (106) thickness. A trench emulation layer (106) thickness may be subject to less variation than a substrate trench depth. A monitor structure (100) may thus be used to monitor features formed by one or more process steps that may vary according to trench depth. Such process steps may include a shallow trench isolation insulator chemical mechanical polishing step. In addition, or alternatively, a monitor structure (100) may be formed on a non-semiconductor-on-insulator (SOI) wafer, but include SOI features, providing a less expensive alternative to monitoring some SOI process steps.

15 Claims, 9 Drawing Sheets

STRUCTURE AND METHOD FOR MONITORING A SEMICONDUCTOR PROCESS, AND METHOD OF MAKING SUCH A STRUCTURE

TECHNICAL FIELD

The present invention relates generally to semiconductor manufacturing processes, and more particularly to methods and structures for monitoring such processes.

BACKGROUND OF THE INVENTION

Semiconductor circuit devices are typically manufactured by a sequence of steps, each of which can deposit and/or modify a layer formed in or on a wafer. While it would be ideal for each step of a process to be absolutely repeatable, in most cases, manufacturing steps can vary over time. Consequently, it may be desirable to monitor particular steps. Thus, if a particular step begins to vary, the process step can be adjusted to provide the desired result.

One common form of process monitoring is to provide monitoring wafers. A monitoring wafer may be run through a set of predetermined manufacturing steps and subsequently examined to determine how one or more of the steps are performing. Because data provided from a monitoring wafer could be used to adjust one or more process steps, it follows that the more reliable and/or accurate a monitoring wafer is, the better a process step can be adjusted.

Spacings, such as trenches or the like, can be an important feature to monitor. As but one example, substrate trenches formed in shallow trench isolation process steps may affect various device features. However, because such substrate trenches can be subject to uncontrollable variation, it can be difficult to monitor particular features that may vary with substrate trench depth.

As another example, silicon-on-insulator (SOI) processes can include spacings (trenches) that separate one semiconductor island (mesa) from another. During SOI process development it can be desirable to characterize how a particular feature can be formed on, and with respect to, such islands. However, an SOI development process monitoring step is typically destructive, in that a wafer may have to be destroyed. Thus, it may be very expensive to develop/monitor/characterize physical features in a SOI process, as many SOI wafers may have to be destroyed.

To better understand the present invention, a first conventional process monitoring method and structure will now be described.

A method of forming a structure that may be used to monitor a process step is shown in FIGS. 5A to 5D. FIGS. 5A to 5D show a series of cross sectional views of a shallow trench isolation (STI) formation process. In the conventional example, a chemical-mechanical polishing (CMP) step can be monitored by measuring a step height of a material that is removed by the CUT step. More particularly, a step height of an insulating material deposited in a substrate trench is measured.

FIG. 5A shows a semiconductor device 500 that may include a substrate 502 on which a trench etch mask 504 may be formed. A trench etch mask 504 can selectively expose portions of a substrate 502 where a trench is to be formed. A substrate 502 may be formed from monocrystalline silicon. A trench etch mask 504 may be formed from a layer of deposited silicon nitride that is patterned with conventional photolithographic techniques. A thin layer of silicon dioxide 505 may be formed over a substrate 502.

FIG. 5B shows trenches 506 that may be formed in a substrate 502 by etching with a trench etch mask 504. Each trench 506 may have a trench depth, one of which is shown by measurement 508. It is noted that a trench etching step may be subject to some variation. Consequently, a trench depth (such as 508) may vary across a wafer and/or between different lots. This will be discussed in more detail below. A trench 508 may be formed by an anisotropic plasma etch, as but one example.

FIG. 5C shows a trench insulating material 510 that has been formed in trenches 506. Such a trench insulating material 510 can provide substrate isolation for particular circuit devices formed in a substrate 502. A trench insulating material 510 may include silicon dioxide deposited with a high density plasma (HDP). As shown in FIG. 5C, following the deposition of a trench insulating material 510, a resulting top surface of a semiconductor device can be uneven. It may therefore be desirable to planarize such a surface.

FIG. 5D shows semiconductor device 500 following a planarizing step. A planarizing step may include chemical mechanical polishing. A resulting structure such as that shown in FIG. 5D may then be used to monitor the planarization process. In particular, a trench insulator step height, shown as 512 and residual nitride thickness may be measured. Such a measurement, ideally, could give an indication as to the rate and/or amount of trench insulating material being removed by a planarization step, or the like.

Thus, a monitoring wafer could be removed at this point, and a trench insulator step height 512 and residual nitride thickness could be measured by taking a cross sectional view of the wafer, or the like.

It has been found that a resulting trench insulator step height can vary according to trench depth. Unfortunately, as noted above, trench depth may vary across a wafer and/or across a lot. Consequently, a given monitoring wafer (or wafer portion) may provide different measurements for a trench insulator step height depending upon a depth of the corresponding trench.

One conventional way of attempting to compensate for such variation is illustrated in FIGS. 6A and 6B. FIGS. 6A and 6B are graphs showing experimentally determined relationships between trench depth and resulting trench insulator step height. In particular, FIG. 6A shows a relationship between trench depth, trench insulator step height, and wafer position. FIG. 6B shows a relationship between trench depth and trench insulator step height. In both of the graphs, as trench depth decreases, step height increases. FIGS. 7A and 7B provide various examples of such relationships in side cross sectional views. FIG. 7A shows the range of values in FIG. 6A. FIG. 7B shows the range of values in FIG. 6B.

FIGS. 7A and 7B include many of the same structures shown in FIGS. 5A to 5D. To that extent like structures will be referred to by the same reference character. FIG. 7A shows a maximum trench depth and corresponding minimum step height 512 and a minimum trench depth and corresponding maximum step height 512' for the values shown in FIG. 6A. Similarly, FIG. 7A shows a maximum trench depth and corresponding minimum step height 512 and a minimum trench depth and corresponding maximum step height 512' for the values shown in FIG. 6B. As shown in FIG. 6B, a minimum step height 512 can be a negative value.

A drawback to the above conventional approach is that a monitoring measurement may not be a direct measurement, but rather an indirect measurement. That is, simply measuring a trench insulator step height does not necessarily give an accurate indication of how a CMP step is performing, as the corresponding trench depth must also be measured. The two values may then be applied to an experimentally determined relationship, such as those shown in FIGS. 7A and 7B.

Still further, it is not clear that experimental results may accurately represent a CMP step for all cases. As but a few examples, if a trench width or trench insulator material is changed, a new experiment may have to be run to determine a relationship between trench depth and trench insulator step height.

In light of the above described background art and example, it would be desirable to arrive at an improved way of monitoring a manufacturing step, where the monitoring includes measuring a feature that may vary according to trench depth.

Having described a first conventional process monitoring method and structure, a second conventional example will now be described.

FIG. 8 shows a conventional SOI monitoring structure. A SOI monitoring structure 800 may include a portion of a SOI wafer having desired features formed thereon. Because a monitoring structure 800 is formed on an SOI wafer, a monitoring structure may include a substrate 802, a substrate insulator 804, and a number of silicon islands 806 formed on a substrate insulator 804.

As is well known, an SOI device may include various features formed in and/or with islands 806. In the particular example of FIG. 8, such features may include a transistor having a source region 808, a channel region 810, a drain region 812, a gate dielectric 814, a gate 816, surrounding gate sidewalls 818, and a gate top insulator 820. In addition, contacts 822 may be formed to an island 806. Such features, and others not mentioned here, can be monitored by viewing a conventional monitoring structure 800 in cross section.

A drawback to such a conventional approach is that in order to monitor various SOI features an SOI wafer must typically be destroyed. Because SOI wafers are expensive, this can add expense to a manufacturing/development operation.

In light of the above described background art and example, it would be desirable to arrive at an improved way of monitoring a SOI process that can be more cost-effective than conventional approaches.

SUMMARY OF THE INVENTION

According to one embodiment, a process monitoring structure may include monitoring trenches that are formed through a substrate emulation layer and terminate at an etch stop layer. Such monitoring trenches can have a trench depth equal to a thickness of a substrate emulation layer. Such a structure may provide trenches having a depth that can be subject to less variation than trenches that are formed in a substrate. Further, such a structure may be used to monitor a semiconductor-on-insulator (SOI) structure, without having to sacrifice a SOI wafer.

According to one aspect of the above embodiment, a substrate emulation layer may include polysilicon and an etch stop layer may include silicon dioxide.

According to another embodiment, a method of forming a process monitoring structure may include forming an etch stop layer on a substrate. A trench emulation layer may then be formed over an etch stop layer. Monitor trenches can be formed by etching through a trench emulation layer to an etch stop layer, which can make a uniform trench depth. This is in contrast to conventional approaches, which may include step height variation from a shallow trench isolation step.

According to one aspect of the above embodiment, monitor trenches may be formed by etching with a shallow trench isolation (STI) etch mask.

According to another aspect of the above embodiment, a shallow trench insulator may be formed over monitor trenches and then planarized. A resulting trench insulator step height may be measured to monitor a planarization process. Results obtained from monitor trenches may be more accurate than those obtained from substrate trenches, which can be subject to greater variation than monitor trenches.

According to another aspect of the above embodiment, SOI structures may be formed with monitor trenches. Such SOI structures may then be examined to monitor/develop/characterize one or more SOI physical process steps. Such structure may thus be formed on a less expensive wafer than a SOI wafer.

According to another embodiment, a method of monitoring a process step may include forming a monitoring structure that includes monitor trenches formed in a first layer. A monitor structure may then run through one or more process steps that form a feature. A corresponding feature formed on, e.g., a production wafer may typically be formed in, with, and/or in relation to trenches formed in a different layer. Because, a monitor trench may be subject to less variation than trenches formed in a different layer, resulting features formed in, with, and/or in relation to a monitor trench may provide a better indication of how process steps are performing. Further, a monitoring structure may be formed to monitor one or more SOI features, but can be formed on a non-SOI wafer. Thus, a more expensive SOI wafer does not necessarily have to be sacrificed.

According to one aspect of the above embodiment, a monitor structure may be configured to monitor a chemical-mechanical polishing step for a shallow trench isolation insulator.

According to another aspect of the above embodiment, a monitor structure may be configured to monitor SOI physical features formed on a non-SOI wafer.

DETAILED DESCRIPTION OF THE EMBODIMENTS

Various embodiments will now be described in conjunction with a number of diagrams. The embodiments set forth a structure for monitoring a process step, a method of manufacturing such a structure, and a method of monitoring a process step with such a structure.

Figure 1A:
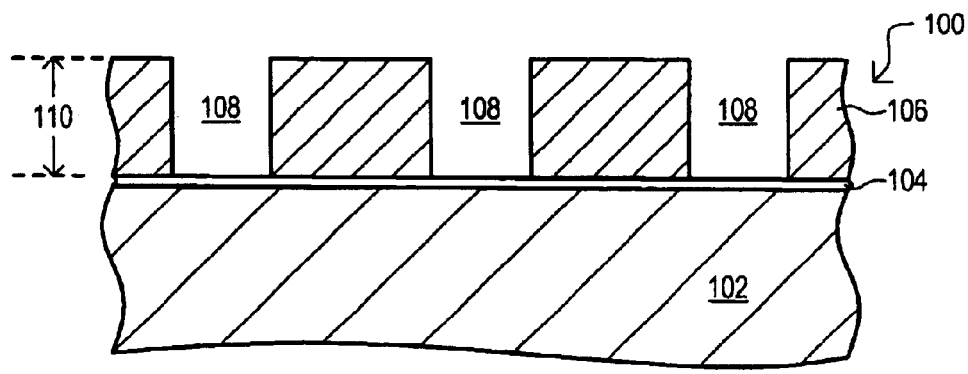
FIG. 1A is a side cross sectional view of a monitoring structure according to one embodiment.
Figure 1B:
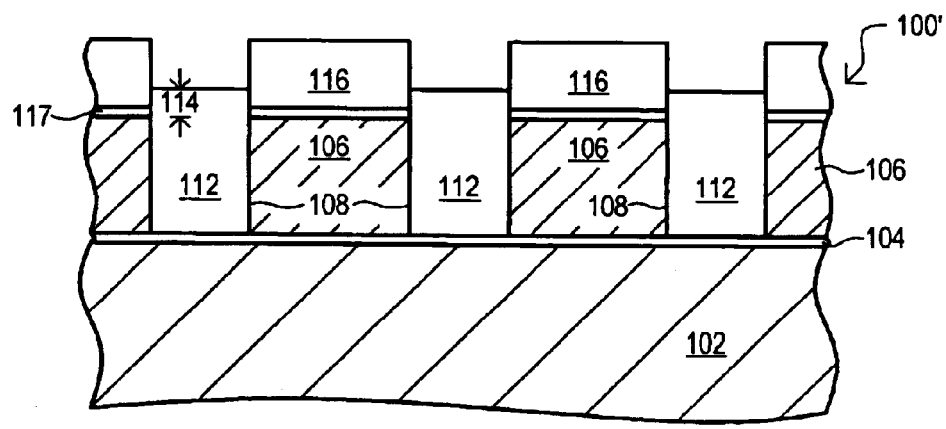
FIG. 1B is a side cross sectional view of a monitoring structure in a shallow trench isolation (STI) monitoring step.
Figure 1C:
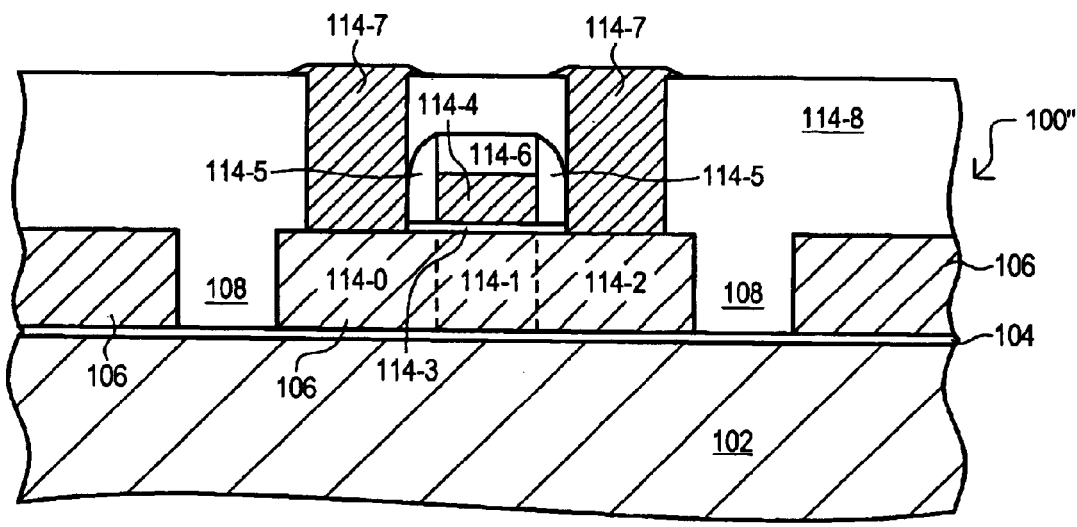
FIG. 1C is a side cross sectional view of a monitoring structure in a silicon (semiconductor)-on-insulator (SOI) monitoring step.

Referring now to FIGS. 1A to 1C, various monitoring structures 100 are shown in side cross sectional views. A monitoring structure 100 may be included on a monitoring wafer that can be run through one or more manufacturing process steps to measure a feature. Such a feature can be formed in conjunction with monitor trenches included in a monitoring structure.

Referring now to FIG. 1A, a monitoring structure 100 may be formed on a substrate 102 and can include a trench etch stop layer 104 formed on a substrate 102. A trench emulation layer 106 may then be formed over a trench etch stop layer 104. A trench emulation layer 106 may have a predetermined thickness that may correspond to a desired trench depth. Monitor trenches 108 may be formed through a trench emulation layer 106. A trench etch stop layer 104 may serve as a bottom for monitor trenches 108.

Because monitor trenches 108 may have a bottom determined by a trench etch stop layer 104, a monitor trench depth, shown as 110, may be essentially equal to a thickness of a trench emulation layer 106. In one particular arrangement, it may be easier to control the thickness of a trench emulation layer 106, than the depth of a trench formed in a thicker layer such as a substrate. Thus, monitor trenches 108 may have more uniform depths than trenches formed in other layers (e.g., a substrate).

A monitoring structure 100 such as that shown in FIG. 1A may then be applied to one or more process steps that are to be monitored. More particularly, such process steps may form features in, with, or in relation to trenches. Such features may vary according to trench depth. However, because monitor trenches 108 may have a more uniform depth than other trenches, a monitoring structure 100 may allow for a more reliable measurement of such features. In addition or alternatively, features that may be formed with respect to a more expensive substrate can be formed on a less expensive monitor structure, reducing process costs.

FIG. 1B provides one particular example of a monitoring structure 100' that can be used to measure a shallow trench isolation (STI) insulator planarization step. A monitoring structure 100' may include some of the same general items as FIG. 1A. To that extent, like items will be referred to by the same reference character.

In the particular example of FIG. 1B, a monitoring structure 100' may monitor a chemical-mechanical polishing (CMP) planarization step by measuring a step height of a silicon dioxide containing trench insulator. On a manufactured device, such a trench insulator may be formed in trenches that have been etched into a substrate. As noted above, in many processes, substrate trenches may be subject to uncontrollable variations. Such variations may result in corresponding variations in a trench insulator step height.

As also noted above, in a conventional approach, a wafer can be pulled from a manufacturing lot, and the step height of a substrate trench insulator may be measured. However, in the structure of FIG. 1B, a trench insulator 112 has been formed in monitor trenches 108, which can provide a more uniform depth. Consequently, a trench insulator step height 114, may be correspondingly more uniform, and thus provide a more accurate representation of a CMP step.

In one very particular example, monitor structures (100 and 100') may include a substrate 102 formed of essentially monocrystalline silicon. A trench etch stop layer 104 may include a layer of silicon dioxide having a thickness less than 500 Å, more particularly less than 250 Å, even more particularly less than 130 Å. A trench emulation layer 106 may include polycrystalline and/or amorphous silicon (referred to herein collectively as polysilicon) having a thickness of less than 5000 Å, more particularly less than 4000 Å, even more particularly less than 3000 Å.

Still further, in one particular STI CMP monitoring function, a monitoring structure 100' may include a trench etch mask 116 formed a thin insulator 117. A trench etch mask 116 may include silicon nitride having a thickness of less than 5000 Å, more particularly less than 3000 Å, even more particularly less than 2000 Å. Further, a trench insulator 112 may include silicon dioxide, such as undoped silicate glass (USG) and/or doped silicate glass including phosphosilicate glass (PSG) and/or borophosphosilicate glass (BPSG). A thin insulator 117 may include silicon dioxide having a thickness in the range of about 20–1000 Å, more particularly in the range of about 30–750 Å, even more particularly in the range of about 50–500 Å.

FIG. 1C provides one particular example of a monitoring structure 100" that can be configured to measure a SOI features without having to destroy a SOI wafer in the process. A monitoring structure 100" may include some of the same general items as FIG. 1A. To that extent, like items will be referred to by the same reference character.

In the particular example of FIG. 1C, a monitoring structure 100" may monitor one or more SOI features by forming such features on a monitor structure 100". Consequently, a trench emulation layer 106 and corresponding monitor trenches 108 may provide a structure that can be physically equivalent to silicon islands in a conventional SOI wafer. However, such a monitoring structure 100" may be formed on a non-SOI wafer and thus may be less expensive than a SOI wafer.

In FIG. 1C, various SOI features may be formed on a monitor structure 100". It is noted that while such features may not always provide an equivalent electrical response as a true SOI features, such features can provide valuable information in the development and/or monitoring of a physical SOI process.

In particular, features that may be formed in, with and/or in relation to monitor trenches 108 of a monitoring structure 100" may include various transistor structures including, but not limited to, a source region 114-0, a channel region 114-1, a drain region 114-2, a gate dielectric 114-3, a gate 114-4, surrounding gate sidewalls 114-5, and a gate top insulator 114-6. Other monitored structures could include island contacts 114-7 and interlayer insulators 114-8. Such features can be monitored by viewing a monitoring structure 100" in cross section In an arrangement such as that shown in FIG. 1C, a trench emulation layer 106 may have a thickness that is equivalent to a silicon island thickness. Further, trenches 108 may be formed that follow SOI lateral isolation patterns.

In this way, a more cost-effective SOI monitoring structure may be formed.

Having described monitoring structures according to various embodiments, a method of forming monitoring structures will now be described with reference to FIGS. 2A to 2D.

Figure 2A:
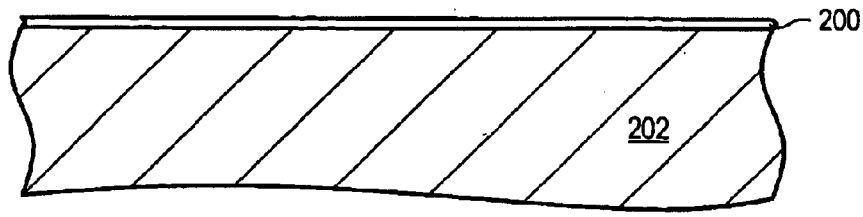
FIGS. 2A to 2D are side cross sectional views showing a method of forming a monitoring structure according to one embodiment.

Referring now to FIG. 2A, a method of forming a monitoring structure may include forming an etch stop layer 200 over a substrate 202. An etch stop layer 200 may be selected to provide an etch selectivity with respect to a trench emulation layer (described below). In one particular arrangement, an etch stop layer 200 may include silicon dioxide formed by oxidizing a substrate 202. In addition or alternatively, such a silicon dioxide layer may be formed by depositing silicon dioxide with low pressure chemical vapor deposition (LPCVD), or the like. An etch stop layer 200 may have a thickness within the ranges discussed in conjunction with FIGS. 1A and 1B.

Figure 2B:
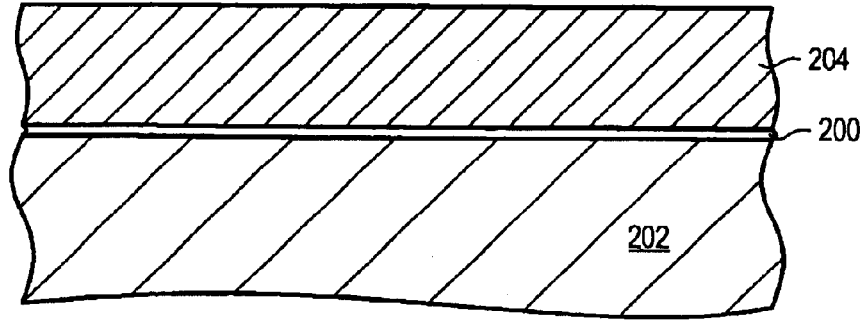

Referring now to FIG. 2B, a monitoring structure forming method may further include forming a trench emulation layer 204 over an etch stop layer 200. A trench emulation layer 204 may be selected to provide an etch response that can be similar to a monitored trench material. As but one example, if a step that varies according to silicon substrate trenches is to be monitored, a trench emulation layer may include polysilicon. Polysilicon may provide a similar etch response to monocrystalline silicon of a substrate. A trench emulation layer 204 may have a thickness within the ranges discussed in conjunction with FIGS. 1A and 1B.

Following the formation of a trench etch stop layer 200 and trench emulation layer 204, monitor trenches may be formed in a trench emulation layer 204. One example of such a step is shown in FIGS. 2C and 2D.

Figure 2C:
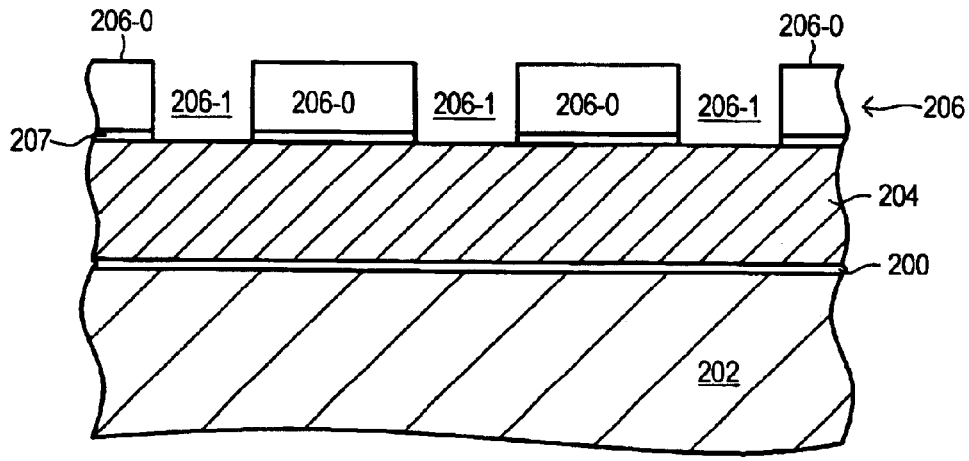

Referring now to FIG. 2C, a trench etch mask 206 may be formed on a thin insulator 207 that is formed over a trench emulation layer 204. A trench etch mask 206 may include masking portions 206-0 and mask openings 206-1. Mask openings 206-1 may be formed over a trench emulation layer 204 at locations where monitor trenches are to be formed. In one particular arrangement, a trench etch mask 206 may be formed by depositing a mask layer over a trench emulation layer 204. Such a mask layer may be patterned using conventional photolithographic techniques. In one arrangement, a mask may include silicon nitride and may include the thickness ranges discussed in conjunction with FIGS. 1A and 1B. A thin insulator 207 may include silicon dioxide having the thickness ranges discussed in conjunction with FIG. 1B.

In one particular embodiment, a trench etch mask 206 may be formed with the same steps used to form etch masks for trenches in a substrate. Thus, following a formation of a trench etch stop layer 200 and trench emulation layer 204, a wafer containing a monitoring structure may be included with "normal" manufactured wafers undergoing a trench etch mask step. A normal manufactured wafer may include non-monitoring wafers. Non-monitoring wafers may include production wafers that may include products. Such products may include commercial products.

Figure 2D:
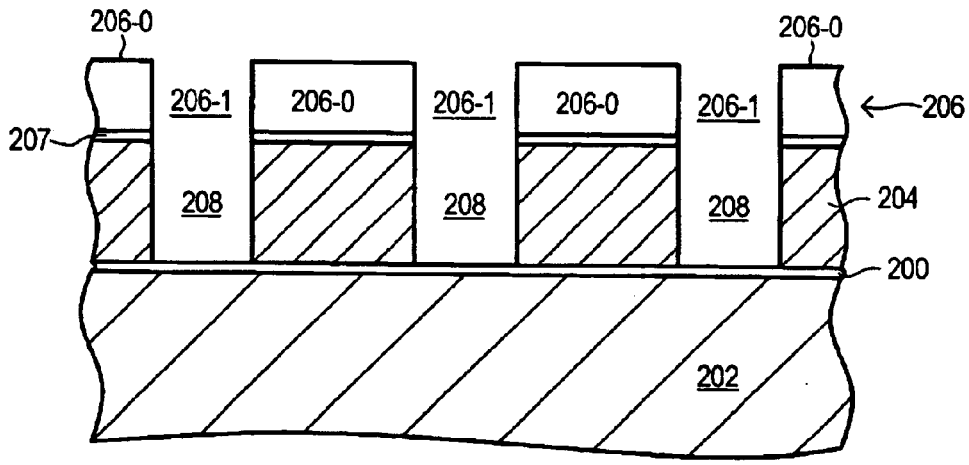

Referring now to FIG. 2D, with a trench etch mask 206 in place, monitor trenches 208 may be formed by etching through a trench emulation layer 204 to a trench etch stop layer 200. Such an etch may have a high selectivity between a trench etch stop layer 200 and a trench emulation layer 204. Such a selectivity may be greater than 25:1, more particularly in the range of about 30:1 to 150:1, more particularly from about 50:1 to 100:1.

In one particular arrangement, a trench emulation layer 204 may include polysilicon and a trench etch stop layer 200 may include silicon dioxide. In such an arrangement, monitor trenches 208 may be formed with a reactive ion silicon etch.

Still further, monitor trenches 208 may be formed with the same steps used to form substrate trenches. Thus, following a formation of a trench etch mask 206, a wafer containing a monitoring structure may be included with non-monitoring wafers undergoing a substrate trench etch step.

In this way, a monitoring structure may include forming monitor trenches in a trench emulation layer. Such monitor trenches may have a reliable depth value, as the bottom of the trenches may be a trench etch mask layer formed underneath a trench emulation layer. For example, a polysilicon trench emulation layer 204 can be deposited on a silicon dioxide trench etch stop layer 200. Such a deposition process may have an inherent range of variability with respect to trench emulation layer 204 thickness. As but one very particular example, a layer of polysilicon may have a target thickness of about 3000 Å, but vary by ±100 Å. Thus, a corresponding monitor trench may have a depth of about 3000 Å ±100 Å. However, a corresponding substrate trench etching step may have a greater degree of variability. As but one very particular example, an etch step may have a target trench depth of about 3000 Å, but vary by about ±700 Å to ±1000 Å. Consequently, monitor trenches may have less variability than substrate trenches.

Having described various steps for forming a monitoring structure according to one embodiment, the use of a monitoring structure in a STI monitoring step will be described with reference to FIG. 2E.

Figure 2E:
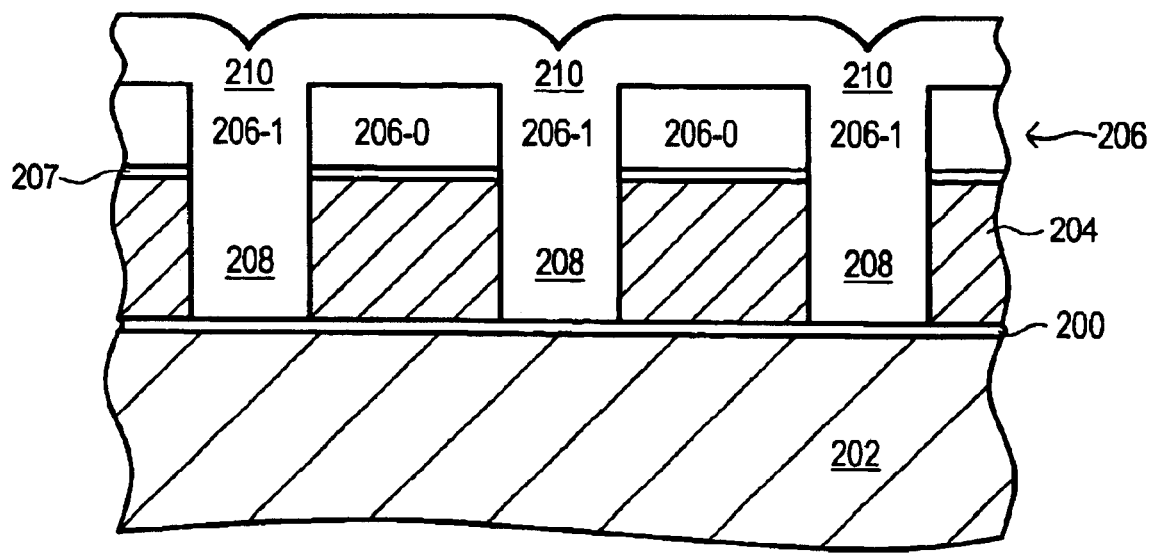
FIG. 2E shows the use of a monitoring structure in a STI monitoring step.

Referring now to FIG. 2E, in a STI monitoring step, a trench insulation material 210 may be deposited into monitoring trenches 208. In the particular example of FIG. 2E, a trench insulation layer 210 may be formed in monitor trenches 208, in mask openings 206-1, and over masking portions 206-0.

A trench insulation material 210 may be selected to provide insulation between substrate portions. As but one example, in a STI monitoring step, a trench insulation material 210 may be formed with the same steps used to form trench insulating material in substrate trenches. Thus, following a formation of monitor trenches 208, a wafer containing a monitoring structure may be included with non-monitoring wafers undergoing a trench insulating material formation step.

In one particular arrangement, a trench insulating material 210 may be formed with a high density plasma. Further, a trench insulating material 210 may be formed from the same range and variety of materials discussed in conjunction with FIG. 1B.

Following the formation of a trench insulating material 210, a planarization step may be performed, more particularly a CMP step. A resulting monitoring structure can appear as set forth in FIG. 1B.

In this way, a monitoring structure may be used to monitor a planarization step in a STI fabrication process.

Having described monitoring structures and methods of manufacture according to particular embodiments, a method of monitoring a feature will now be described with reference to FIG. 3.

Figure 3:
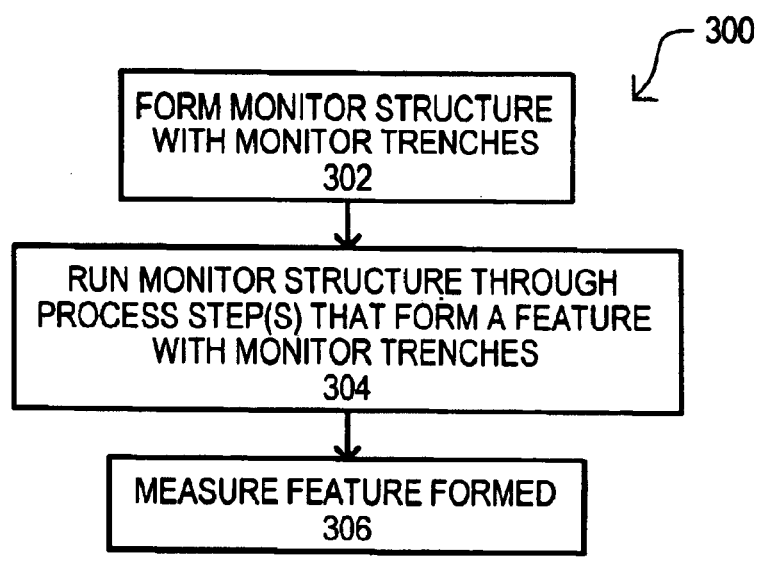
FIG. 3 is a flow diagram of a monitoring method according to one embodiment.

FIG. 3 is a flow diagram showing one embodiment of a monitoring method. A monitoring method is designated by the general reference character 300 and includes forming a monitor structure with monitor trenches (step 302). Such a step may include, as noted above, forming trenches that extend through a deposited layer and that stop at an etch stop layer. In one particular embodiment, a monitor structure following a step 302 may appear as shown in FIG. 2D.

A monitoring method 300 may further include running the monitor structure through one or more process steps that form a feature with a monitor trench (step 304). Such a step may produce a feature that can be more accurate than one formed with another type of trench. In one particular embodiment, a step 304 may include the steps shown in FIGS. 2D and 1B. A feature may include a trench insulator step height (such as 112). In another particular embodiment, a step 304 may include forming SOI features such as those shown in FIG. 1C.

A monitoring method 300 may further include measuring a feature that can vary according to trench depth (step 306). Such a feature, as noted above, may include a trench insulator step height, or various SOI device features.

In this way a process step may be monitored with a monitor structure that includes monitor trenches. Such a structure may provide less variation in a measured feature than conventional approaches that may include trenches formed in a different fashion. In addition, or alternatively, such a structure may be less costly than conventional approaches that may use different starting materials.

Having described one monitoring method with reference to FIG. 3, a more detailed monitoring method, aimed at monitoring a STI CMP step will now be described with reference to FIG. 4A.

Figure 4A:
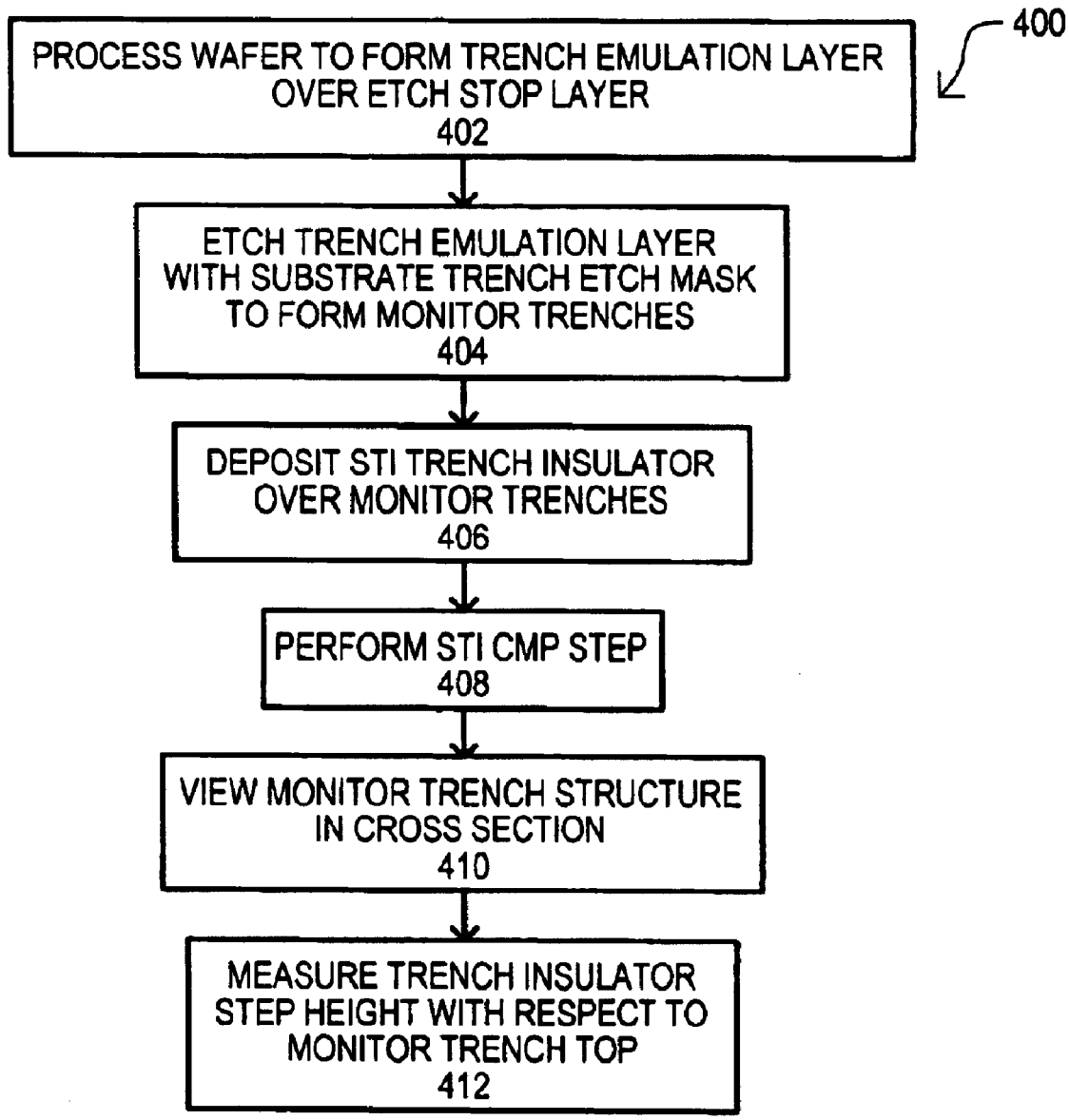
FIGS. 4A and 4B are a flow diagrams of a monitoring method according to other embodiments.

A monitoring method 400 according to FIG. 4A may include processing a wafer to form a trench emulation layer over an etch stop layer (step 402). In one embodiment, a trench emulation layer may have a thickness equal to an optimal STI trench depth. A wafer following a step 402 may appear as shown in FIG. 2B.

A monitoring method 400 may also include etching a trench emulation layer with a substrate trench etch mask to form monitor trenches (step 404). Such a step may include forming an etch mask with a mask set that is normally used to form STI trenches. In this way, monitor trenches may be formed that can include the same lateral feature sizes as STI trenches. A wafer following a step 404 may appear as shown in FIG. 2D.

It is noted that a step 404 may include placing a monitor wafer with non-monitoring wafers undergoing normal fabrication steps. In particular, as an etch mask is being formed on the substrate surface of normal wafers, the same etch mask may be formed over a trench emulation layer on a monitor wafer. Then, as non-monitoring wafers are being etched to form trenches in a substrate, a monitor wafer may be etched to form monitor trenches. Of course, monitor trenches may be etched separately from non-monitoring wafers.

Once monitoring trenches have been formed, a monitoring method 400 may continue by depositing an STI trench insulator over monitoring trenches (step 406). Like a step 404, a step 406 may include placing a monitor wafer with non-monitoring wafers undergoing normal fabrication steps. In particular, as STI trench insulator is filling substrate trenches of normal wafers, the STI trench insulator may also fill monitor trenches of a monitor wafer. Of course, monitor trenches may be filled separately from non-monitoring wafers.

An STI trench insulator CMP step may then be performed (step 408). Such a step may include placing a monitor wafer in a CMP machine and planarizing a trench insulator layer with the same process used to planarize an STI trench insulator in a non-monitoring fabrication process. Because CMP machines can typically accommodate multiple wafers, such a step may include non-monitoring wafers at the same time as a monitor wafer. Of course, a monitor wafers may be planarized separately from non-monitoring wafers.

The monitoring method of FIG. 4A is shown to further include viewing a monitor structure in cross section (step 410). Such a step may include removing a monitor wafer from a manufacturing process and viewing it in cross section. More particularly, such a step may include cleaving and/or ion milling a monitor wafer to give a side cross sectional view of a monitor structure.

A monitoring method 400 can also include measuring a trench insulator step height with respect to a monitor trench (step 412). Such a step may include measuring the amount by which a trench insulator extends above or below a top surface of a trench emulation layer. As but one example, such a measurement may be accomplished by viewing a monitor structure with a scanning electron microscope.

In this way, a STI CMP step may be monitored by measuring a STI trench insulator step height. However, unlike a conventional case that may measure a step height with respect to a substrate trench, according to the embodiment of FIG. 4A, a step height can be measured with respect to a monitor trench. As described previously, a monitor trench may have less variation than a substrate trench. Because a STI trench insulator step height can vary according to trench depth, a measurement such as that described in step 412 may provide a better indication of how a STI CMP step is performing than a conventional measurement taken with respect to a substrate trench.

It is noted that while particular embodiments have described the invention in conjunction with STI and STI CMP fabrication steps, such an arrangement should not be construed as limiting to the invention. The present invention may provide a way of measuring other features that may vary according to a trench depth. Such a measurement may be subject to less variation, as a monitor trench depth may be subject to less variation than the depth of other trenches formed in a different fashion.

Having described a method aimed at monitoring a STI CMP step, a detailed method aimed at monitoring a SOI process will now be described with reference to FIG. 4B.

Figure 4B:
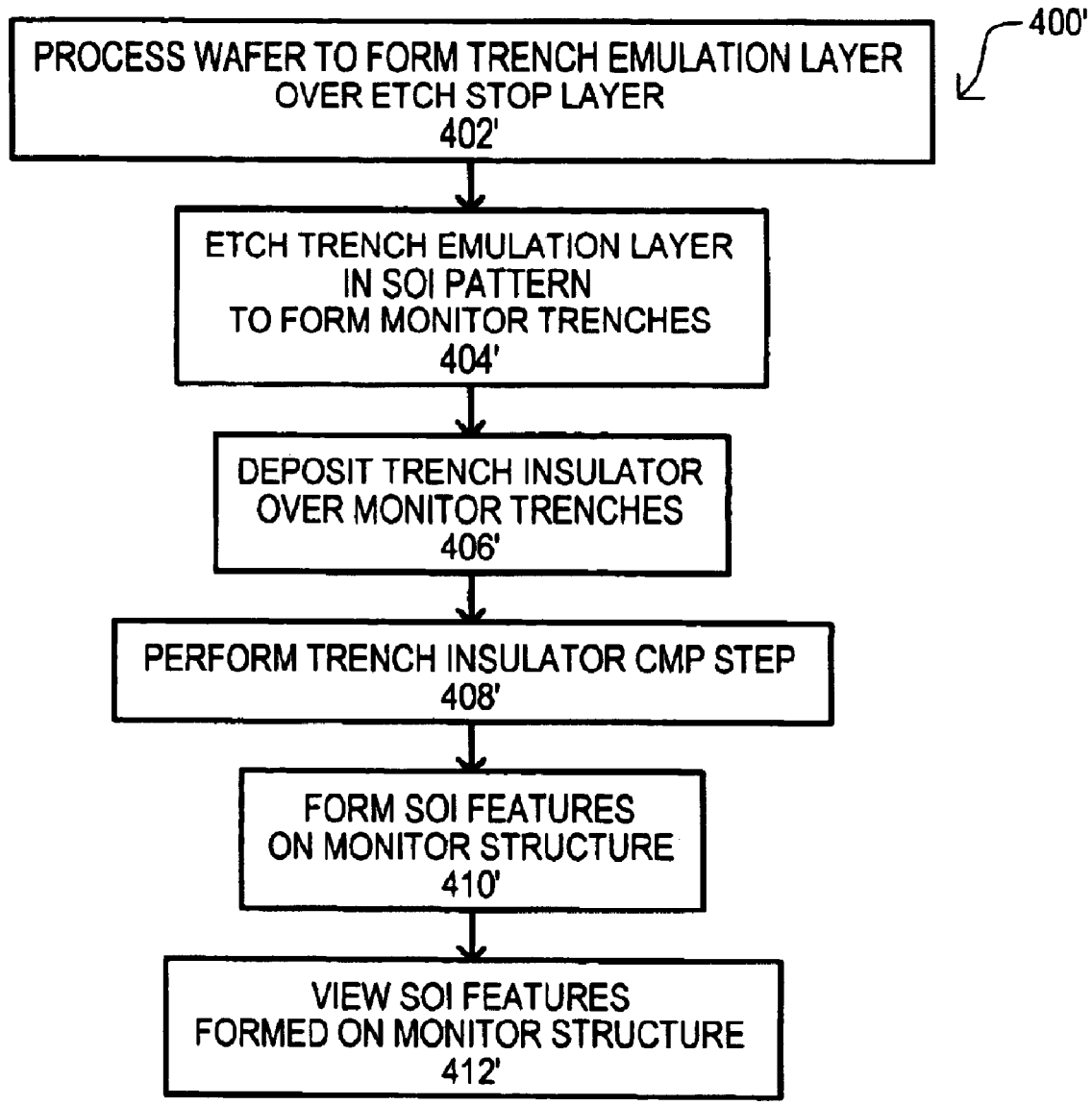
Figure 5A:
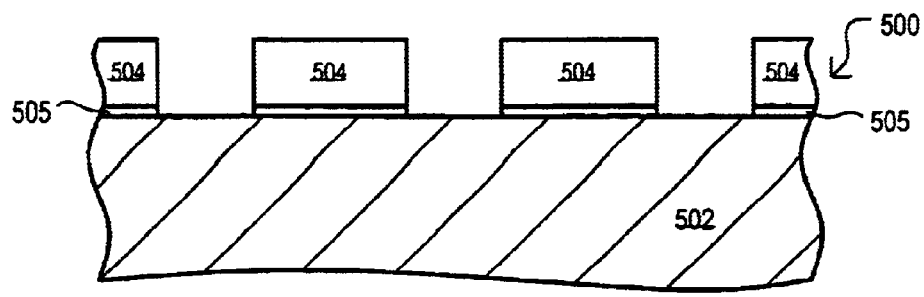
FIGS. 5A to 5D are side cross sectional views of a conventional method of monitoring a STI trench isolation step.
Figure 5B:
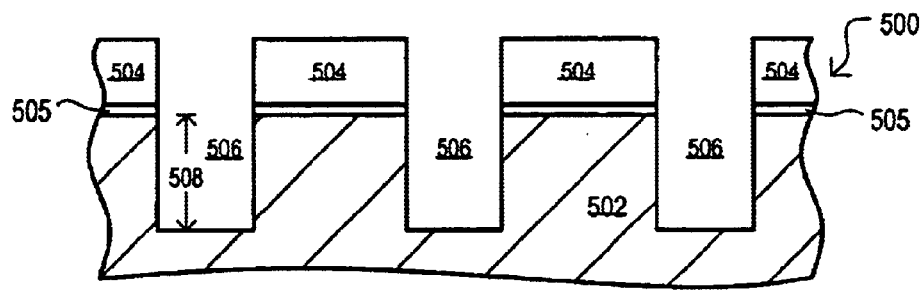
Figure 5C:
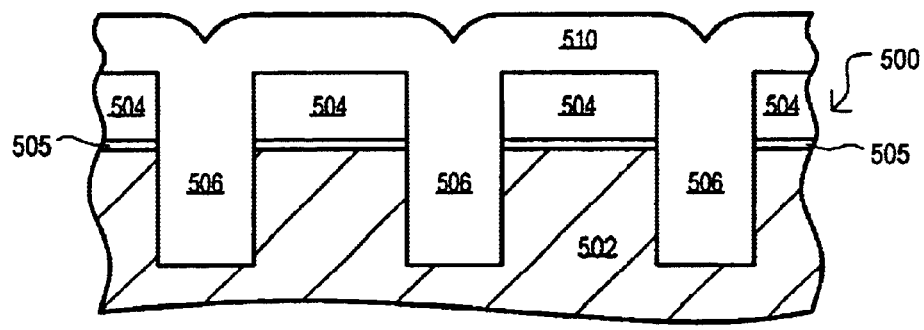
Figure 5D:
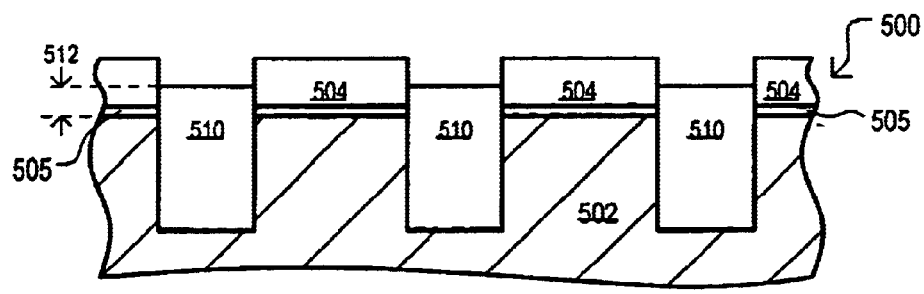
Figure 6A:
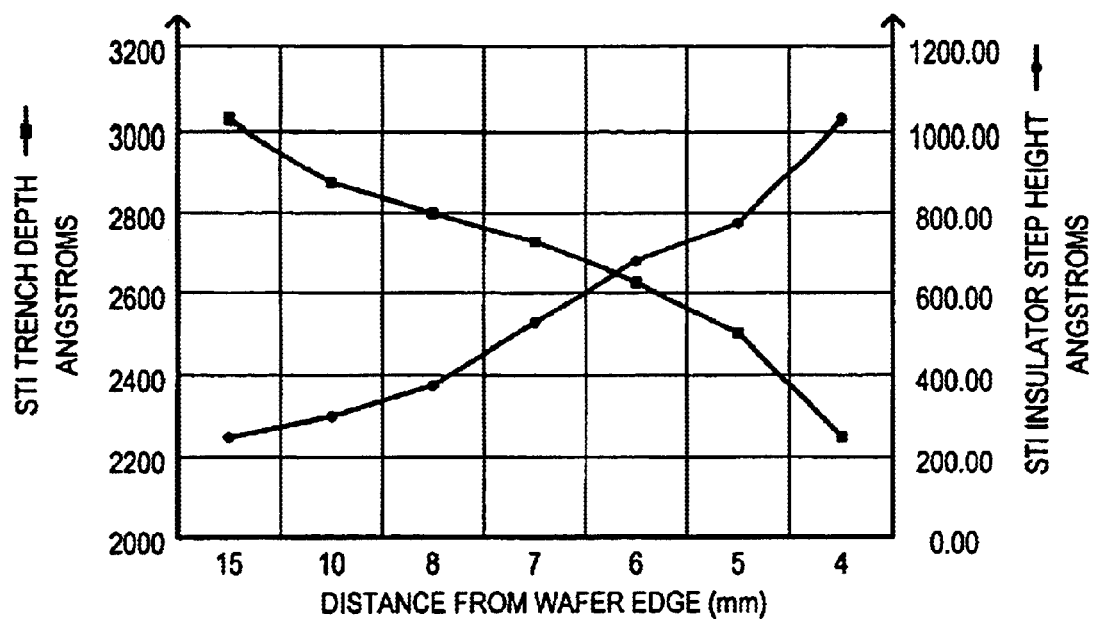
FIGS. 6A and 6B are graphs showing variations in STI insulator step height with respect to trench depth.
Figure 6B:
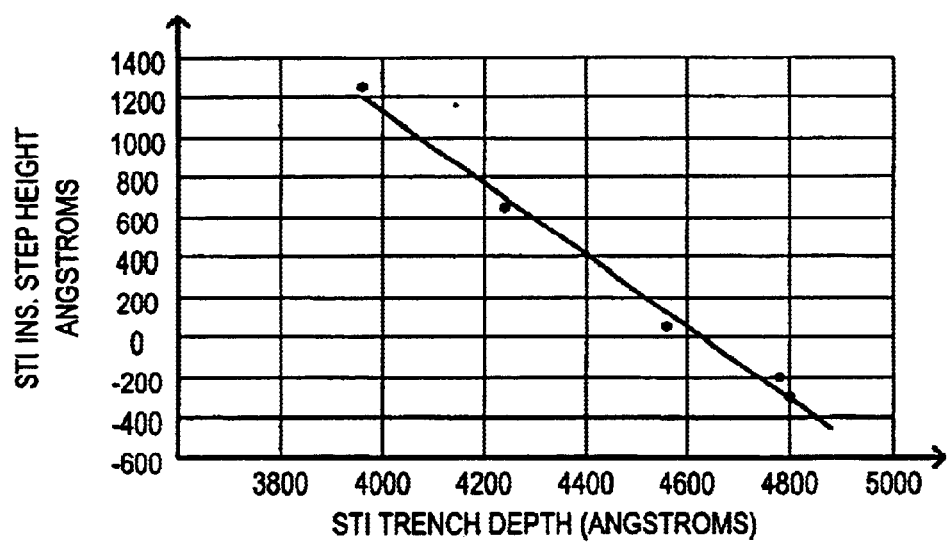
Figure 7A:
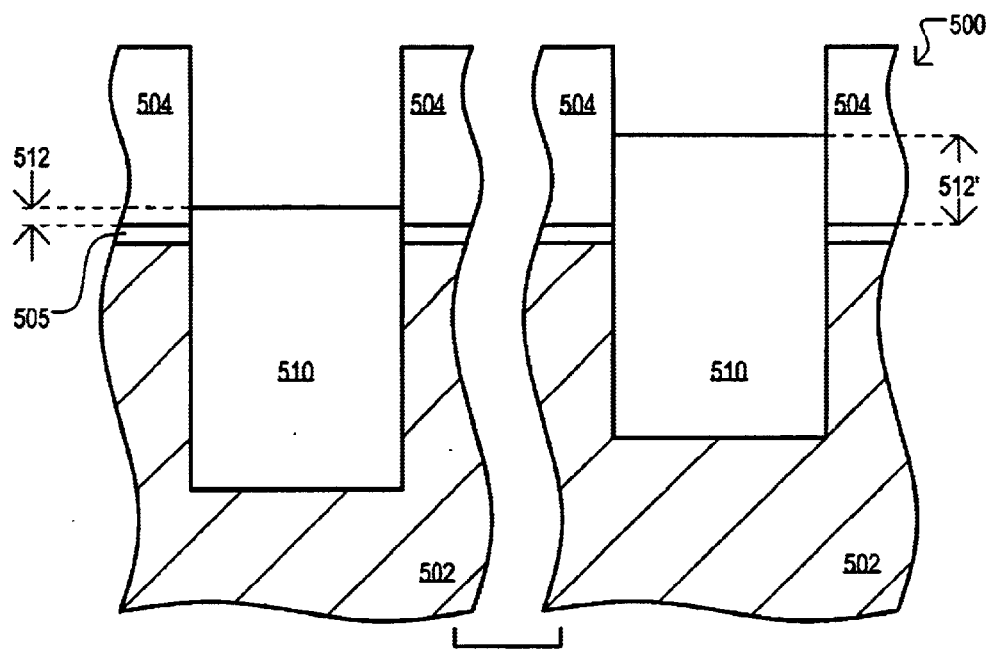
FIGS. 7A and 7B are side cross sectional views illustrating the variations described by FIGS. 6A and 6B.
Figure 7B:
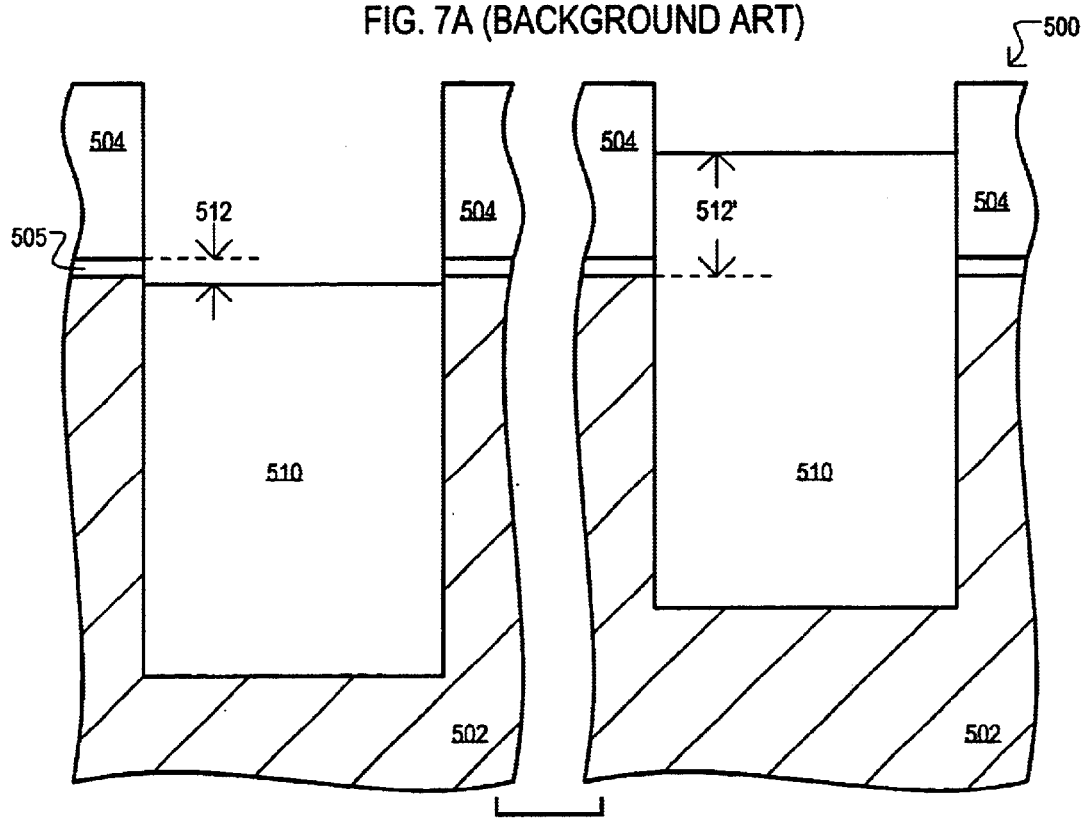
Figure 8:
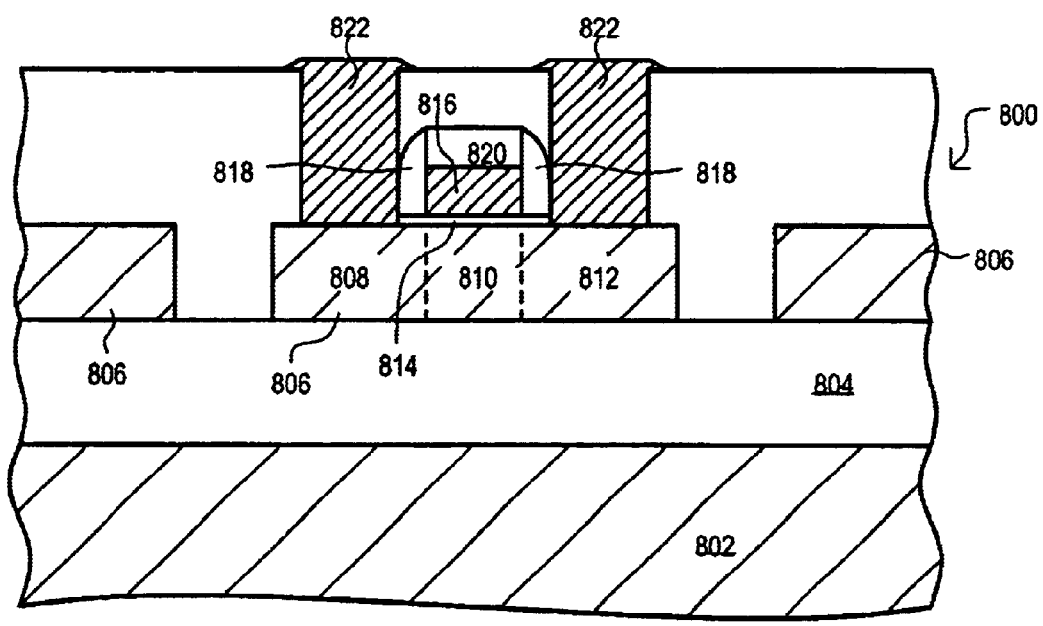
FIG. 8 is a side cross sectional view illustrating a conventional method of monitoring SOI features.

A monitoring method 400' according to FIG. 4B may include processing a wafer to form a trench emulation layer over an etch stop layer (step 402'). In one embodiment, a trench emulation layer may have a thickness equal to a SOI island thickness. A wafer following a step 402' may appear as shown in FIG. 2B.

A monitoring method 400' may also include etching a trench emulation layer in a SOI pattern to form monitor trenches (step 404'). Such a step may include forming an etch mask that can have the same general pattern as a SOI pattern. Such an etch mask may include masking portions where SOI silicon islands exist, and mask openings where lateral isolation between islands exist. A wafer following a step 404' may appear as shown in FIG. 2D.

Once monitoring trenches have been formed, a monitoring method 400' may continue by depositing a trench insulator over monitoring trenches (step 406').

An trench insulator CMP step may then be performed (step 408'). Such a step may include placing a monitor wafer in a CMP machine and planarizing a trench insulator layer.

A monitoring method 400' may further include forming SOI features on a monitor structure (step 410'). Such a step may include placing a monitor wafer with non-monitoring SOI wafers undergoing normal fabrication steps. In particular, as transistor and/or contact and/or an interlayer dielectric are formed on SOI wafers, the same features may be formed on a monitor wafer. Of course, features formed on a monitor trenches may be formed separately from non-monitoring SOI wafers. A monitor structure following a step 410' may appear as shown in FIG. 1C.

The monitoring method of FIG. 4B is shown to further include viewing SOI features formed with a monitor structure (step 412'). Such a step may include removing a monitor wafer from a manufacturing process and viewing it in cross section. More particularly, such a step may include cleaving and/or ion milling a monitor wafer to give a side cross sectional view of a monitor structure.

In this way, SOI features may be formed on a non-SOI wafer and then viewed to develop/monitor a SOI process. This is in contrast to a conventional case that may form such structures on a more expensive SOI wafer.

Of course, the various examples described name but a few of the many SOI features that may be observed. Further, it may be desirable to observe a SOI process at various process steps. In such a case, multiple non-SOI wafers with monitor structures may be run through the process steps with a each wafer being viewed for a particular feature.

Thus, it is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A method of forming a monitoring structure, comprising the step of:

depositing a first layer to a predetermined thickness equivalent to a desired trench depth;

etching the first layer to form monitor trenches that extend through the first layer and stop at an etch stop layer on a monitor wafer; and forming a feature in, with, or in relation to the monitor trenches, wherein a process to be monitor with said monitoring structure forms a corresponding non-monitor trench in a different layer or material than the first layer, the feature varies according to a different trench depth.

2. The method of claim 1, further including:

forming the etch stop layer comprising silicon dioxide on a semiconductor substrate; and depositing the first layer includes depositing a layer comprising polysilicon having a thickness less than 5000 angstroms.

3. The method of claim 1, further including:

the process to be monitored forms the non-monitor trench in a normal wafer; and the monitor a is a non semiconductor-on-insulator (SOI) wafer and the normal wafer is a SOI wafer having semiconductor islands of a predetermined thickness; and depositing the first layer of the predetermined thickness.

4. The method of claim 1, wherein:

etching the first layer includes forming a substrate trench etch mask on he first layer.

5. The method of claim 1, wherein:

etching the first layer includes forming a substrate trench etch mask pattern that essentially matches a semiconductor-on-insulator wafer lateral island isolation pattern.

6. The method of claim 1, wherein:

etching the first layer includes substantially anisotropically etching with a selectivity between the first layer and the etch stop layer of greater than 30:1.

7. The method of claim 1, wherein:

forming a feature includes planarizing a trench insulator material that extends inside the monitor trenches.

8. The method of claim 7, wherein:

planarizing includes chemical-mechanical polishing the trench insulator material.

9. The method of claim 1, wherein:

forming a feature includes forming a feature selected from the group consisting of at least a portion of a semiconductor-on-insulator (SOI) transistor, SOI contact, and SOI interlayer dielectric.

10. A method of monitoring a semiconductor manufacturing process, comprising the steps of:

processing a monitor wafer having monitoring trenches formed in a first process layer of the monitoring wafer according to at least one process step that forms a feature, the feature being formed in a non-monitoring wafer in, with, or in relation to a different process layer than the first process layer in the semiconductor manufacturing process; wherein the first layer comprises a deposited layer and the different layer comprises a wafer substrate.

11. The method of claim 10, wherein:

the first layer comprises a deposited layer and the different layer comprises a semiconductor island layer formed as part of a semiconductor-on-insulator wafer substrate.

12. The method of claim 10, wherein:

the at least one process step includes depositing and planarizing a trench insulating material.

13. The method of claim 10, further including:

running th monitor wafer through the at least one process step with at least one normal wafer.

14. The method of claim 10, further including:

the feature include a trench insulator step height; and examining the monitor structure in cross section to measure the insulator step height.

15. The method of claim 14, wherein:

the at least one process step include a shallow trench isolation (STI) insulator deposition step and a STI insulator chemical-mechanical polishing step.

* * * * *